(12) United States Patent
Takeuchi et al.

(10) Patent No.: US 6,307,146 B1
(45) Date of Patent: Oct. 23, 2001

(54) AMORPHOUS SILICON SOLAR CELL

(75) Inventors: Yoshiaki Takeuchi; Masayoshi Murata; Akemi Takano; Tatsuyuki Nishimiya, all of Nagasaki; Syouji Morita, Yokohama; Tatsufumi Aoi, Nagasaki; Tatsuji Horioka, Tokyo, all of (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/404,409

(22) Filed: Sep. 23, 1999

(30) Foreign Application Priority Data

Jan. 18, 1999 (JP) .................................... 11-009377
Aug. 23, 1999 (JP) .................................... 11-235509

(51) Int. Cl.⁷ .............................................. H01L 31/0376
(52) U.S. Cl. .......................... 136/258; 136/249; 136/255
(58) Field of Search ............................ 136/258, 252, 136/249, 255; 257/184, 461, 55

(56) References Cited

U.S. PATENT DOCUMENTS

| 4,728,370 | 3/1988 | Ishii et al. | 136/258 |
|---|---|---|---|
| 5,230,746 | * 7/1993 | Wiedeman et al. | 136/249 |
| 5,391,410 | 2/1995 | Nii et al. | 427/578 |
| 5,417,770 | * 5/1995 | Saitoh et al. | 136/258 |
| 5,447,117 | * 9/1995 | Yoneyhara et al. | 117/7 |
| 5,484,658 | * 1/1996 | Ihara et al. | 428/428 |
| 5,562,781 | 10/1996 | Ingram et al. | 136/249 |
| 5,582,880 | 12/1996 | Mochizuki et al. | 427/569 |
| 5,677,236 | 10/1997 | Saitoh et al. | 437/109 |
| 5,700,467 | * 12/1997 | Shima et al. | 136/249 |
| 5,736,431 | * 4/1998 | Shinohara et al. | 438/96 |
| 5,738,731 | 4/1998 | Shindo et al. | 136/249 |
| 5,776,819 | * 7/1998 | Mahan et al. | 438/482 |
| 5,994,164 | * 11/1999 | Fonash et al. | 438/97 |

* cited by examiner

*Primary Examiner*—Rena L. Dye
*Assistant Examiner*—Michael C. Miggins
(74) *Attorney, Agent, or Firm*—John P. White; Cooper & Dunham LLP

(57) ABSTRACT

An amorphous silicon solar cell includes a substrate, a transparent electrode formed on this substrate, a power-generating film formed on this transparent electrode, and a back-side electrode formed on this power-generating film. The power-generating film is formed by sequentially stacking p-type/i-type/n-type hydrogenated amorphous silicon layers. The defect density of the i-type hydrogenated amorphous silicon layer is less than $10^{15}$ defects/cc.

2 Claims, 4 Drawing Sheets

AMORPHOUS SILICON SOLAR CELL

BACKGROUND OF THE INVENTION

The present invention relates to an amorphous silicon solar cell used in a solar cell power generation system.

The arrangement shown in FIG. 3 U.S. Pat. No. 2,530,408 is known as a conventional solar cell.

A transparent electrode 2, a power-generating film 3, and a metal electrode 4 are formed in this order on a glass substrate (or transparent film) 1. The power-generating film 3 is constructed of a p-type a-$Si_xC_{1-x}$:H layer (p layer) 5, an i-type a-SiH layer (i layer) 6, and an n-type a-Si:H layer (n layer) 7. The p layer 5 as a window layer is made of amorphous silicon carbide to increase its optical forbidden band width. Also, to control the valence electron of the p layer 5, diborane ($B_2H_6$) is added as a doping gas to the source gas in the formation of the p layer 5. In the solar cell with this construction, light enters from the glass substrate 1, passes through the transparent electrode 2 and the p layer 5, and reaches the i layer 6 where the optical energy is converted into electrical energy.

Since the i layer 6 is a light-absorbing/power-generating layer in the solar cell shown in FIG. 3, the film properties of this i layer 6 have a direct influence on the characteristics of the solar cell. Also, the output current of the solar cell is determined by the light absorption characteristic and film thickness of the solar cell material. That is, if the absorption coefficient is small, the film thickness must be increased; if the absorption coefficient is large, the film thickness can be small. In the amorphous silicon solar cell, the absorption coefficient to light of 500 to 700 nm having the greatest influence on the output current increases as the number of defects in the amorphous silicon film forming the i layer 6 decreases, i.e., as the number of unbonded hands of Si decreases. For example, when a film having a defect density of $3 \times 10^{15}$ defects/cc is applied to the i layer of a single type amorphous silicon solar cell, the film thickness of the i layer 6 must be 400 nm or more to increase the initial efficiency as shown in FIG. 4. However, if the film thickness of the i layer 6 is thus increased, a long time is required to form this i layer 6, lowering the productivity.

Additionally, if the film thickness of the i layer 6 is increased to raise the initial efficiency, the stabilization efficiency declines because the rate of optical degradation increases. On the other hand, if the film thickness of the i layer 6 is decreased, the degradation rate decreases. However, as shown in FIG. 5, the stabilization efficiency does not increase because the initial efficiency is small.

BRIEF SUMMARY OF THE INVENTION

It is an object of the present invention to provide an amorphous silicon solar cell in which the defect density of an i-type hydrogenated amorphous silicon layer forming a power-generating layer is less than $10^{15}$ defects/cc and which thereby can raise the initial efficiency without lowering the productivity and achieve high stabilization efficiency compared to conventional solar cells.

It is another object of the present invention to provide an amorphous silicon solar cell in which the thickness of an i-type hydrogenated amorphous silicon layer is 300 nm or less and which thereby can improve the productivity compared to conventional solar cells.

According to the present invention, there is provided an amorphous silicon solar cell comprising a transparent substrate, a transparent electrode formed on the transparent substrate, a power-generating film formed on the transparent electrode, and a back-side electrode formed on the power-generating film, characterized in that the power-generating film is formed by sequentially stacking p-type/i-type/n-type hydrogenated amorphous silicon layers, and a defect density in the i-type hydrogenated amorphous silicon layer is less than $10^{15}$ defects/cc.

Also, according to the present invention, there is provided an amorphous silicon solar cell comprising a substrate, a transparent electrode formed on the substrate, a power-generating film formed on the transparent electrode, and a back-side electrode formed on the power-generating film, characterized in that the power-generating film is formed by sequentially stacking n-type/i-type/p-type hydrogenated amorphous silicon layers, and a defect density in the i-type hydrogenated amorphous silicon layer is less than $10^{15}$ defects/cc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An amorphous silicon solar cell according to the first invention of the application concerned comprises a transparent substrate, a transparent electrode formed on the transparent substrate, a power-generating film formed on the transparent electrode, and a back-side electrode formed on the power-generating film, characterized in that the power-generating film is formed by sequentially stacking p-type/i-type/n-type hydrogenated amorphous silicon layers, and a defect density in the i-type hydrogenated amorphous silicon layer is less than $10^{15}$ defects/cc.

Also, an amorphous silicon solar cell according to the second invention of the application concerned comprises a substrate, a transparent electrode formed on the substrate, a power-generating film formed on the transparent electrode, and a back-side electrode formed on the power-generating film, characterized in that the power-generating film is formed by sequentially stacking n-type/i-type/p-type hydrogenated amorphous silicon layers, and a defect density in the i-type hydrogenated amorphous silicon layer is less than $10^{15}$ defects/cc.

In the present invention, the defect density in the i-type hydrogenated amorphous silicon layer (i layer) is prescribed to be less than $10^{15}$ defects/cc because if the defect density has a larger value, the stabilization defect density after light irradiation increases, so no high stabilization efficiency can be obtained when this layer is applied to the cell. "Stabilization" means 20 to 100 hr.

Figure 4:
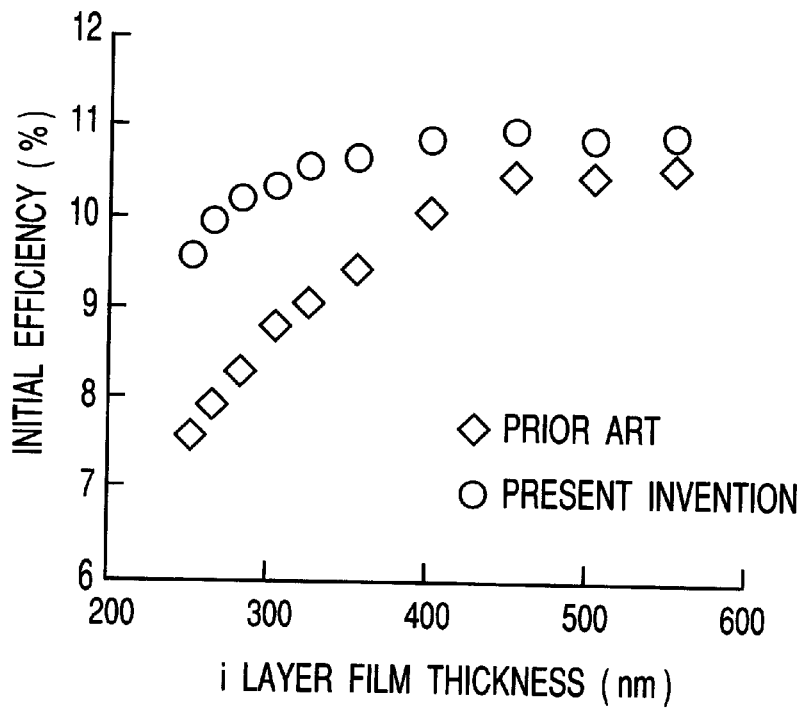
FIG. 4 is a graph showing the relationship between the i layer film thickness and the initial efficiency in solar cells according to prior art and the present invention.
Figure 5:
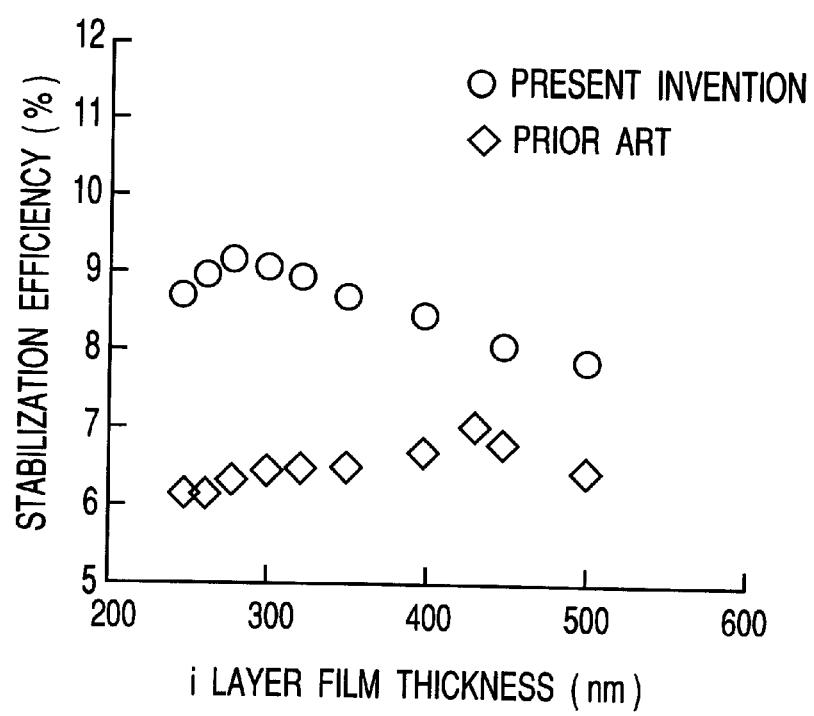
FIG. 5 is a graph showing the relationship between the i layer film thickness and the stabilization efficiency in the solar cells according to the prior art and the present invention.

In the present invention, the i layer thickness is preferably 300 nm or less because when the thickness is 300 nm or less, the optical degradation rate decreases, and this increases the efficiency (FIGS. 4 and 5). This optical degradation rate is defined by (initial efficiency−stabilization efficiency)÷initial efficiency. Comparing FIG. 4 with FIG. 5 shows that the optical degradation rate declines as the i layer film thickness decreases. FIG. 4 also indicates that a film having large defect density ($10^{15}$ defects/cc or more) produces a large reduction in the initial efficiency when the i layer film thickness decreases. However, this reduction is small in the film of the present invention. As a result, the aforementioned condition is derived.

Figure 8:
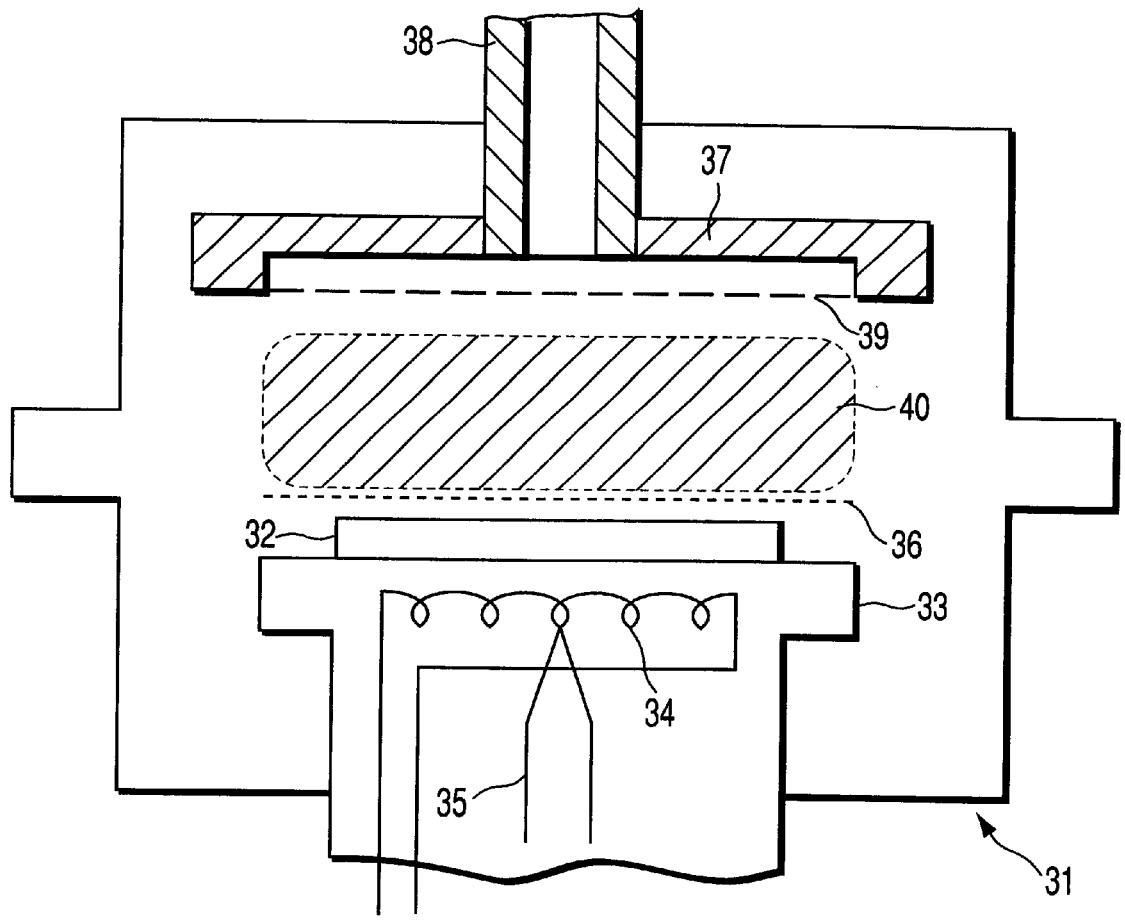
FIG. 8 is a view for explaining the main components of a plasma CVD apparatus according to the present invention.

FIG. 8 is a sectional view showing the major parts of a plasma CVD apparatus according to the present invention. In FIG. 8, reference numeral 31 denotes a plasma chamber. A substrate holder 33 supporting a substrate 32 is placed in this chamber 31. The substrate holder 33 contains a substrate heater 34 for heating the substrate 32 and a thermocouple 35 for controlling the temperature of the substrate heater 34. This substrate heater 34 controls the temperature of the substrate 32. A water-cooling mechanism (not shown) for cooling the substrate heater 34 is built into the substrate heater 34. A mesh like second heater 36 is positioned above the substrate holder 33 in the chamber 31. An RF electrode 37 is placed on the side of the second heater 36 away from the side opposite to the substrate holder 33 with the heater 34 sandwiched between them. This RF electrode 37 has a gas supply pipe 38. A gas supply hole 39 for supplying a gas into the plasma chamber 31 is formed in the surface of the RF electrode 32 that faces the second heater 36. In FIG. 8, reference numeral 40 denotes a plasma.

The plasma CVD apparatus with this construction is generally used by using a monosilane ($SiH_4$) gas as a gas at a flow rate of 20 to 100 sccm, a pressure of 50 to 200 mTorr, an RF power of 5 to 60W, and a substrate temperature of 160 to 200° C.

DESCRIPTION OF THE PREFERRED EMBODIMENT EXAMPLES

Amorphous silicon solar cells according to examples of the present invention will be described below with reference to the accompanying drawings.

Example 1

Figure 1:
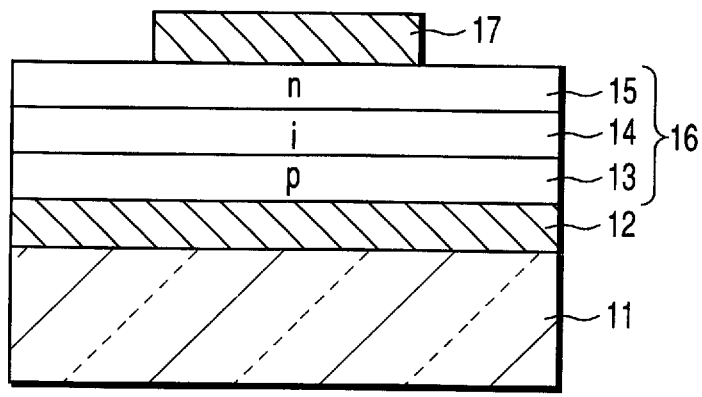
FIG. 1 is a sectional view showing an amorphous silicon solar cell according to Example 1 of the present invention.

FIG. 1 will be described below.

A tin oxide transparent electrode 12 is formed on a glass substrate 11 as a transparent substrate. A power-generating film 16 constructed of a p layer 13, an i layer 14, and an n layer 15 is formed on the transparent electrode 12. Each of these p, i, and n layers 13, 14, and 15 is a hydrogenated amorphous silicon (a-Si:H) layer. The thickness of the i layer 13 is 300 nm or less, e.g., 290 nm, and its defect density is less than $10^{15}$ defects/cc. An Al back-side electrode 17 is formed on the power-generating film 16.

The amorphous silicon solar cell with this construction is manufactured as follows by using the abovementioned apparatus shown in FIG. 8.

First, a glass substrate 11 on which a transparent electrode 12 was formed was ultrasonically cleaned with a neutral detergent and ultra pure water in this order to remove contamination adhered to the surfaces. Subsequently, a power-generating film 16 constructed of a p layer 13, an i layer 14, and an n layer 15 was formed on this transparent electrode 12 by plasma CVD. Before the formation of each layer, the apparatus was evacuated by a turbo molecular pump until the internal pressure of the apparatus decreased to $5 \times 10^{-7}$ Torr or less, and the substrate temperature was raised to and maintained at a predetermined temperature (150° C. to 180° C.). The p layer was formed by using $SiH_4$, $CH_4$, and $H_2$ as source gases and $B_2H_6$ as a doping gas. The i layer was formed by using $SiH_4$ as a source gas. The n layer was formed by using $SiH_4$ and $H_2$ as source gases and $PH_3$ as a doping gas. The film thicknesses of these p, i, and n layers were 9.5 nm, 290 nm, and 30 nm, respectively. The back-side electrode 17 was formed on this power-generating film 16 by vacuum vapor deposition, thereby manufacturing an amorphous silicon solar cell.

The amorphous silicon solar cell manufactured as above has the following effects.

Figure 3:
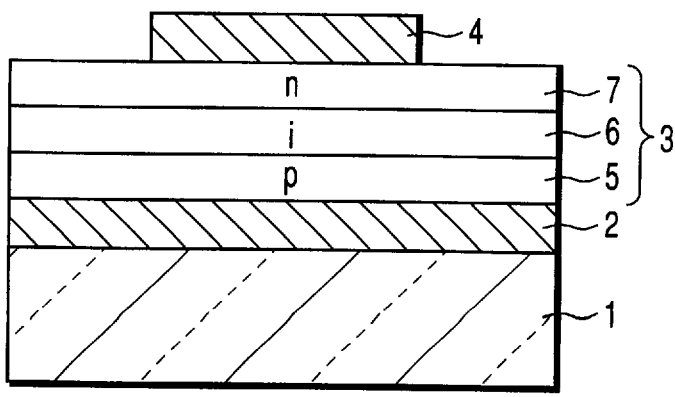
FIG. 3 is a sectional view showing a conventional amorphous silicon solar cell.
Figure 6:
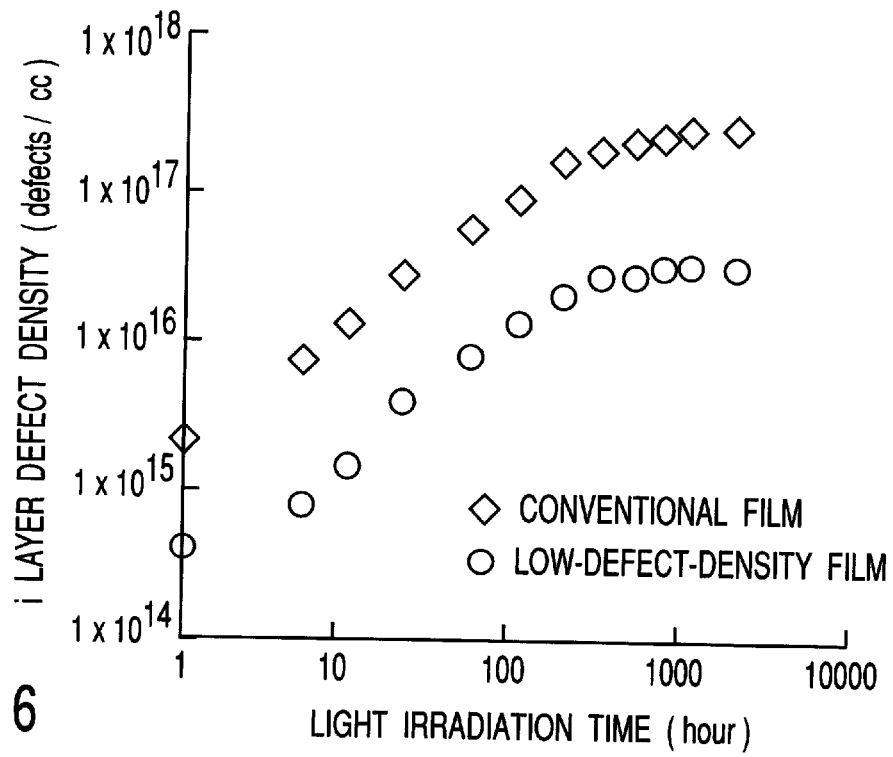
FIG. 6 is a graph showing the relationship between the light irradiation time and the i layer defect density in the solar cells according to the prior art and the present invention.
Figure 7:
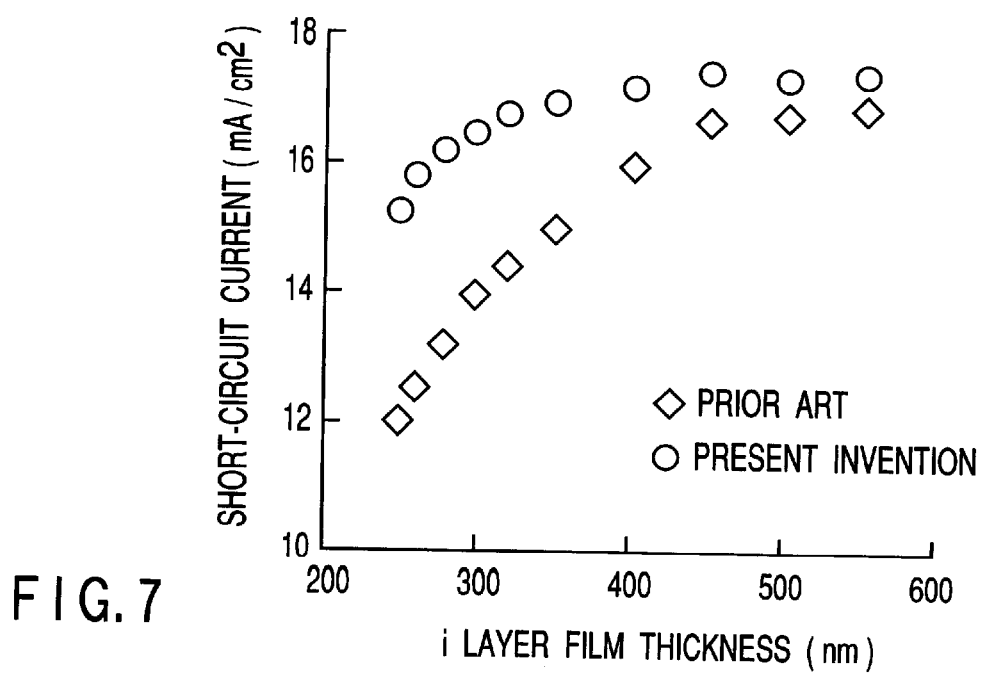
FIG. 7 is a graph showing the relationship between the i layer film thickness and the short-circuit current in the solar cells according to the prior art and the present invention.

The i layer 14 forming the power-generating film 17 is a hydrogenated amorphous silicon layer having a defect density of less than $10^{15}$ defects/cc. Therefore, as shown in FIG. 6, the stabilization defect density after light irradiation is smaller than that of a conventional film. Hence, a high stabilization coefficient can be obtained when this layer is applied to the cell. Also, this low-defect-density film has a large absorption coefficient to long-wavelength light (500 to 700 nm). Accordingly, even when the thickness of the i layer 14 is decreased (290 nm in the present invention, while the conventional film thickness is about 400 to 500 nm), a reduction of the output current is small, so high efficiency can be obtained (FIGS. 3 and 6).

Additionally, when the thickness of the i layer 14 is decreased, the field intensity in this i layer increases. As a consequence, it is possible to further suppress optical degradation and obtain high stabilization efficiency as shown in FIG. 5. The productivity can also be increased. In effect, when the thickness of the i layer 14 was 300 nm, which was about ¾ the conventional film thickness (400 to 500 nm), the productivity improved by about 20%.

Example 2

Figure 2:
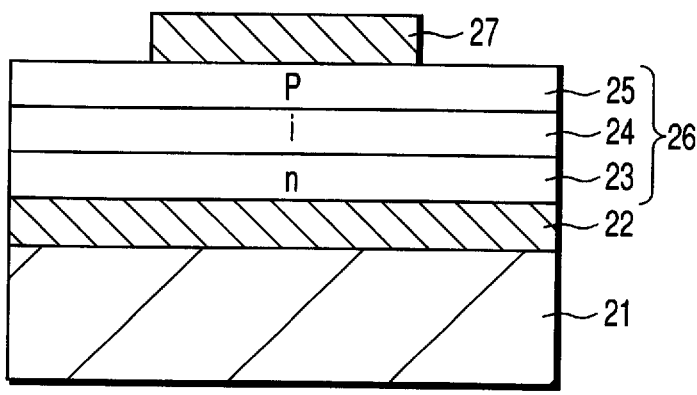
FIG. 2 is a sectional view showing an amorphous silicon solar cell according to Example 2 of the present invention.

FIG. 2 will be described below.

An Ag transparent electrode 22 is formed on a stainless substrate 21. A power-generating film 26 constructed of an n layer 23, an i layer 24, and a p layer 25 is formed on this transparent electrode 22. Each of these n, i, and p layers 23, 24, and 25 is a hydrogenated amorphous silicon (a-Si:H) layer. The thickness of the i layer 24 is 300 nm or less, e.g., 290 nm, and its defect density is less than $10^{15}$ defects/cc. An ITO transparent back-side electrode 27 is formed on the power-generating film 26.

As in Example 1, Example 2 can achieve high stabilization efficiency and increase the productivity.

According to the present invention as has been described in detail above, it is possible to provide an amorphous silicon solar cell in which the defect density of an i-type hydrogenated amorphous silicon layer forming a power-generating layer is less than $10^{15}$ defects/cc and which thereby can raise the initial efficiency without lowering the productivity and achieve high stabilization efficiency compared to conventional solar cells.

The present invention can also provide an amorphous silicon solar cell in which the thickness of an i-type hydrogenated amorphous silicon layer is 300 nm or less and which thereby can improve the productivity compared to conventional solar cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amorphous silicon solar cell comprising a transparent substrate, a transparent electrode formed on said transparent substrate, a power-generating film formed on said transparent electrode and a back-side electrode formed on said power-generating film, characterized in that said power-generating film is formed by sequentially stacking p-type/i-type/n-type hydrogenated amorphous silicon layers, and a defect density in said i-type hydrogenated amorphous silicon layer is less than $1\times10^{15}$ defects/cc and wherein a thickness of said i-type hydrogenated amorphous silicon layer is not more than 300 nm.

2. An amorphous silicon solare cell comprising a substrate, a transparent electrode formed on said substrate, a power-generating film formed on said transparent electrode, and a back-side electrode formed on said power-generating film, characterized in that said power-generating film is formed by sequentially stacking n-type/i-type/p-type hydrogenated amorphous silicon layers, and a defect density in said i-type hydrogenated amorphous silicon layer is less than $1\times10^{15}$ defects/cc and wherein a thickness of said i-type hydrogenated amorphous silicon layer is not more than 300 nm.

* * * * *